US008012365B2

(12) United States Patent
Dussart et al.

(10) Patent No.: US 8,012,365 B2
(45) Date of Patent: Sep. 6, 2011

(54) DEEP ANISOTROPIC SILICON ETCH METHOD

(75) Inventors: Remi Dussart, Saint Pryve-Saint Mesmin (FR); Philippe Lefaucheux, Mareau Aux Pres (FR); Xavier Mellhaoui, Fontaine (FR); Lawrence John Overzet, Richardson, TX (US); Pierre Ranson, Orleans (FR); Thomas Tillocher, Olivet (FR); Mohamed Boufnichel, Monnaie (FR)

(73) Assignee: STMicroelectronics, SA, Montrouge (FR)

( * ) Notice: Subject to any disclaimer, the term of this patent is extended or adjusted under 35 U.S.C. 154(b) by 822 days.

(21) Appl. No.: 12/080,706

(22) Filed: Apr. 3, 2008

(65) Prior Publication Data
US 2008/0293250 A1  Nov. 27, 2008

(51) Int. Cl.
*H01L 21/3065* (2006.01)
(52) U.S. Cl. .............. 216/37; 216/67; 216/79; 438/712; 438/733; 257/E21.218
(58) Field of Classification Search .................. None
See application file for complete search history.

(56) References Cited

U.S. PATENT DOCUMENTS

| 4,867,841 | A | * | 9/1989 | Loewenstein et al. ........ 438/711 |
| 4,943,344 | A | | 7/1990 | Tachi et al. |
| 6,303,512 | B1 | | 10/2001 | Laermer et al. |
| 2001/0045354 | A1 | | 11/2001 | Wang et al. |
| 2004/0097090 | A1 | | 5/2004 | Mimura et al. |
| 2008/0293250 | A1 | * | 11/2008 | Dussart et al. ................ 438/712 |

OTHER PUBLICATIONS

Meint, J. De Boer et al., "Guidelines for etching silicon MEMS structures using fluorine high-density plasmas at cryogenic temperatures," Journal of Microelectromechanical Systems, IEEE Service Center, Piscataway, NJ, US, vol. 11, No. 4, Aug. 4, 2008, pp. 385-401.
Min, Jae-Ho et al., "Angular dependence of etch rates in the etching of poly-SI and fluorocarbon polymer using SF6, C4F8, and O2 plasmas," Journal of Vacuum Science and Technology A. Vacuum, Surfaces and Films, American Institute of Physics, New York, NY, vol. 22, No. 3, May 3, 2004, pp. 661-669.

* cited by examiner

*Primary Examiner* — Allan Olsen
(74) *Attorney, Agent, or Firm* — The Noblitt Group, PLLC

(57) ABSTRACT

A method of anisotropic plasma etching of a silicon wafer, maintained at a temperature from −40° C. to −120° C., comprising alternated and repeated steps of:
  etching with injection of a fluorinated gas, into the plasma reactor, and
  passivation with injection of silicon tetrafluoride, $SiF_4$, and of oxygen into the plasma reactor, the flow rate of the gases in the plasma reactor being on the order of from 10% to 25% of the gas flow rate during the etch step.

7 Claims, 2 Drawing Sheets

DEEP ANISOTROPIC SILICON ETCH METHOD

BACKGROUND OF THE INVENTION

1. Field of the Invention

The present invention relates to the field of microcomponents and microsystems, and more specifically to methods of deep anisotropic etching of a silicon wafer.

2. Discussion of the Related Art

Two main methods for anisotropically etching wells, trenches or ribs (mesas) in silicon wafers are industrially used.

A first so-called alternated method is for example described in U.S. Pat. No. 5,501,893 of Bosch Company.

As illustrated in FIGS. 1A to 1D, the alternated method comprises a repeated succession of etch and polymerization steps which are implemented at a temperature close to the ambient temperature.

FIG. 1A is a partial view of a silicon wafer 1 coated with a protection layer 2, for example, a silicon oxide layer in which an opening 3 has been formed, for example, a circular hole or a strip of small width. The silicon wafer is placed in a plasma reactor (not shown) and a first recess 3 is etched by plasma in the trench. For this etching, a fluorinated compound, for example, sulfur hexafluoride, $SF_6$, is injected into the plasma reactor.

At the next step, illustrated in FIG. 1B, a gas such that the resulting active components in the reactor are likely to form a polymer 4 on the silicon walls of recess 3 is introduced into the plasma reactor. This polymer forming gas is for example trifluoromethane, $CHF_3$ or $C_4F_8$. The formed polymer is a film of a material that can be assimilated to Teflon $(CF_2)_n$.

In a next etch step illustrated in FIG. 1C, the fluorinated plasma first etches by ion bombarding the polymer layer at the bottom of recess 3, then forms a complementary isotropic etch 5.

By repeating the above steps, an etch 7 is obtained in silicon wafer 1, as illustrated in FIG. 1D.

The second so-called cryogenic method for anisotropically etching a silicon wafer is illustrated in FIG. 2 which shows a silicon wafer 1 coated with a hard mask 2, for example, made of oxide. The wafer is placed in a plasma reactor on a susceptor cooled down to a very low temperature, for example, around −100° C., and a plasma etch in the presence of sulfur and oxygen hexafluoride is then performed. The method is continuous, that is, there are no alternated steps of etching and deposition of a protection layer on the walls of the recess being formed. With this method, a passivation layer 9 of $SiO_xF_y$ type, that is, a saturated material, not likely to form a polymer, forms on the recess walls.

Each of these two conventional methods has advantages and disadvantages.

A disadvantage of the structure obtained by the alternated method is that the walls of the obtained well, trench or rib are grooved while they are smooth with the cryogenic method.

Another disadvantage of the alternated method with respect to the cryogenic method lies in the forming of a polymer on the recess walls. This polymer is difficult to remove, which makes the method poorly adapted to certain applications in electronics where the quality of the contact with the trench walls is particularly important. This polymer not only deposits in the formed recess but also on the reactor walls, which obliges to frequently cleaning this reactor and causes an efficiency decrease and method drifts. However, with the second method, deposited material 9 becomes gaseous when the wafer is brought back from the deposition temperature (approximately −100° C.) to the ambient temperature and eliminates by itself.

Another disadvantage of the alternated method lies in the fact that, in given plasma conditions, the etchings are substantially twice as slow, i.e. half as fast as with the cryogenic method.

The cryogenic method is better adapted to the forming of patterns of small extent with respect to the size of the wafer to be processed (opening rate smaller than 20%) and at short etch times (shorter than one hour), that is, in cases where a small amount of matter is to be removed. Conversely, the alternated method is better adapted to micromechanical applications, of MEMS type, for which there often is a large amount of matter to be etched.

The alternated method has the advantage of a reliable operation, that is, once the plasma conditions have been set, the etch rate and the shape of the obtained opening are well reproducible even if the operating parameters vary a little. Conversely, the cryogenic method has the disadvantage of being very sensitive to the operating parameters and especially to temperature. When the temperature varies slightly, for example, by approximately 1° C., either from one area of a wafer being processed to another, or for two successively-processed wafers, there result variations in the etch rate and in the shape of the etched recess. Especially, if the conditions are poorly set, one tends to have an opening which, instead of having properly vertical walls, exhibits a conical shape, the conicity being directed downwards or upwards according to whether the temperature is too high or too low.

Another advantage of the alternated method is that its implementation causes a relatively light underetch under mask 2, for example, on the order of 0.2 μm. However, by this prior cryogenic method, a relatively significant underetch, on the order of one μm, is obtained.

Another advantage of the alternated method is its simplicity of implementation, since it is not necessary to provide means for cooling the processed wafer.

A third method is described in U.S. Pat. No. 6,303,512 of Bosch Company. However, unlike the two previously-described methods, this third method has, to the present applicants' knowledge, had no industrial application. The third method provides, in one of its many alternative embodiments, a plasma etch at ordinary or slightly lower temperature (the given example is +10° C.) by sulfur and oxygen hexafluoride, and in the simultaneous or alternated presence of silicon tetrafluoride, $SiF_4$. The oxygen and silicon tetrafluoride flow rates in the plasma enclosure are of the same order of magnitude as the $SF_6$ flow rate, or even greater (see claims 3, 17, and 18). The etch and passivation phases may be alternated.

The present applicants have carried out tests by attempting to reproduce the conditions described in U.S. Pat. No. 6,303,512, without injecting any $C_4F_8$. The present applicants have found, in particular, that the application of the method of this patent would result in a blocking of the silicon etch, and in all cases to a very slow etching with respect to the etch rates of the two previously-described methods. Further, as indicated by the patent, there forms on the opening walls silicon nitride or oxide, which is difficult to eliminate.

Further, the present applicants have tried the method of U.S. Pat. No. 6,303,512, at cryogenic temperatures, lower than −40° C. (not suggested in the patent) and have noted, in this case as well, a complete blocking of the etch process.

SUMMARY OF THE INVENTION

Thus, a feature of the present invention is to provide a novel silicon plasma etch method which eliminates at least some of the disadvantages of one or the other of the above-mentioned conventional methods.

To achieve this feature, the present invention provides a method of anisotropic plasma etching of a silicon wafer, maintained at a temperature from −40 to −120° C., comprising alternated and repeated steps of:

etching with injection of a fluorinated gas, into the plasma reactor, and passivation with injection of silicon tetrafluoride, $SiF_4$, and of oxygen into the plasma reactor, the flow rate of the gases in the plasma reactor being on the order of from 10 to 25% of the gas flow rate during the etch step.

According to an embodiment of the present invention, the fluorinated gas is selected from the group comprising or consisting of $SF_6$, $NF_3$, $F_2$.

According to an embodiment of the present invention, the fluorinated gas is sulfur hexafluoride, $SF_6$.

According to another embodiment of the present invention, the temperature is maintained at approximately −90° C.

According to still another embodiment of the present invention, an oxygen injection is performed into the plasma reactor during the etch steps.

According to still another embodiment of the present invention, the proportion between oxygen and sulfur hexafluoride is on the order of from 5 to 10%.

According to still another embodiment of the present invention, during the passivation steps, the proportion between oxygen and silicon tetrafluoride is on the order of from 50 to 80%.

The foregoing and other features, and benefits of the present invention will be discussed in detail in the following non-limiting description of specific embodiments in connection with the accompanying drawings.

DETAILED DESCRIPTION

The present invention uses, like the first-previously-described prior method, an etch method, in which etch and passivation steps are performed alternately and repeatedly.

The present invention also provides, like the second previously-described prior method, a cryogenic etch method, that is, in which the silicon temperature is low during the processing.

The present invention also provides, like the third previously-described prior method, a method in which sulfur hexafluoride and possibly oxygen are used for the etching and a mixture of silicon tetrafluoride and oxygen is used for the passivation.

However, the present application eliminates the disadvantages of each of the prior methods by providing new proportions of the gaseous composition during the passivation steps, and possibly during the etch steps.

Figures 1A, 1B, 1C, 1D:
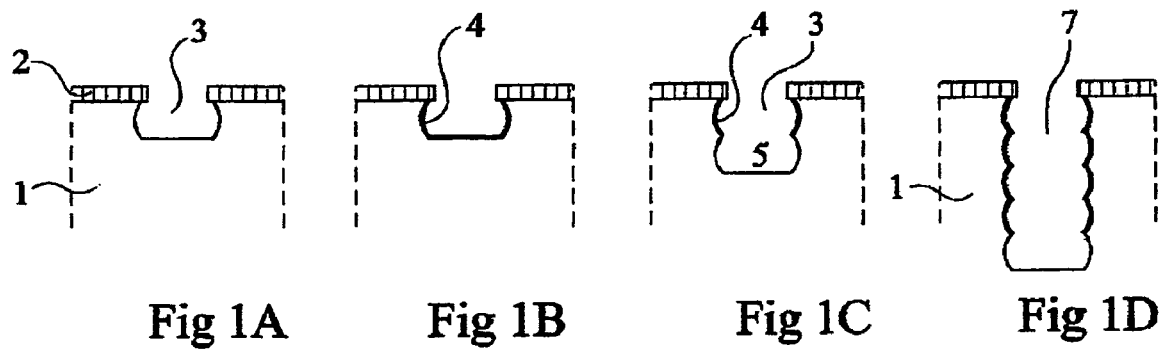
FIGS. 1A to 1D illustrate an alternated etch method according to a known technique.
Figure 2:
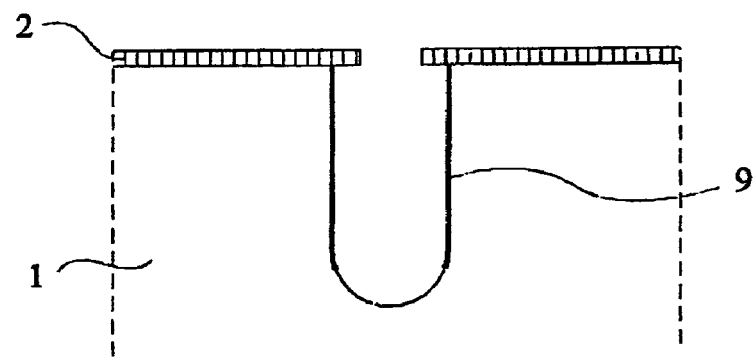
FIG. 2 illustrates a cryogenic etch method according to a known technique.
Figure 3:
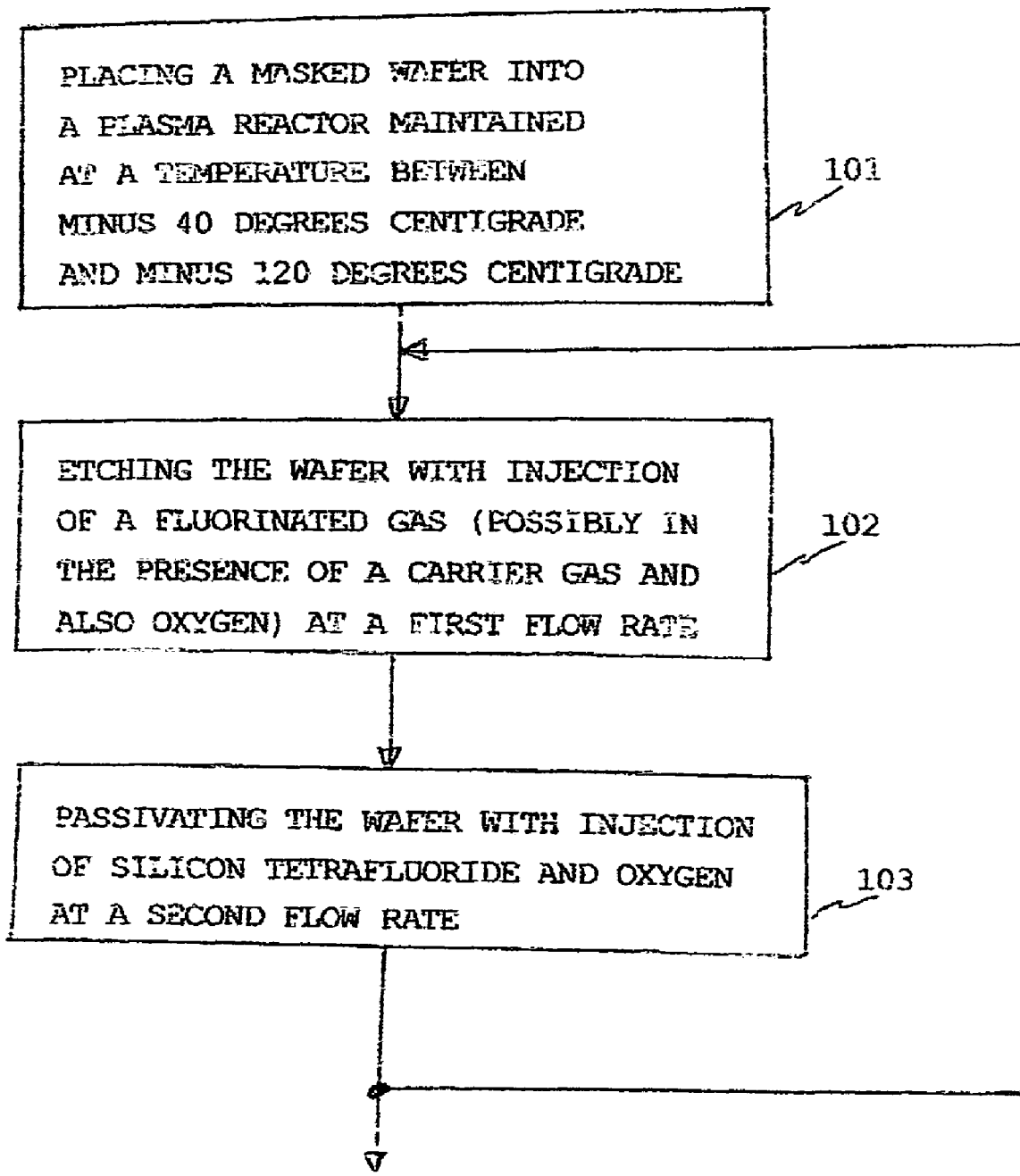
FIG. 3 is a flow chart illustrating an exemplary embodiment in accordance with the present invention.

Thus, as illustrated in FIG. 3, at blocks 101, 102, and 103, the present invention provides: placing a silicon wafer masked at the locations where no etching is desired to be performed into a plasma reactor (see block 101). The temperature of the wafer placed into the plasma reactor is maintained at a relatively low temperature, selected between −40° C. and −120° C., for example, on the order of −90° C. During the etch steps (see block 102), a fluorinated gas of e.g. sulfur hexafluoride type, $SF_6$, is inserted into the plasma enclosure, possibly in the presence of a carrier gas, for example, argon or another rare gas (or non-reactive gas) and possibly also in the presence of oxygen, at a first flow rate. Then, during the passivation step (see block 103), silicon tetrafluoride, $SiF_4$, and oxygen are injected into the reactor, possibly in the presence of a carrier gas, at a second flow rate. During this passivation step, the passivating gas flow is on the order of from 10% to 25% of the gas flow (of the first flow rate) in the plasma reactor during the etch step. There then forms, on the walls of the recess being formed, a passivation layer of $SiO_xF_y$ type as in the prior cryogenic method, that is, a layer of a carbon-free non-contaminating material. As compared with the prior cryogenic method, it can be acknowledged that the $SiO_xF_y$ layer is thicker and that the method becomes little sensitive to small temperature variations: the shape of the formed recess and its etch rate are substantially constant even if the temperature varies by a few degrees.

According to the present invention, underetches of the same order of magnitude than with the prior alternated method, that is, much lighter than with the prior cryogenic method, are obtained.

As a summary, according to the present invention, one obtains:

an etch rate intermediary between that of the alternated method and that of the prior cryogenic method, a recess or trench having a grooved structure substantially identical to that obtained by the prior alternated method, a low sensitivity to operating temperature variations, and especially to temperature variations, on the walls of the recess being formed, a deposition of $SiO_xF_y$ type which eliminates greatly by itself, by evaporation, when the silicon wafer is brought back to the ambient temperature (on the order of 20° C.) after the processing.

Fluorinated etch gases other than $SF_6$ may be used. For example, one may use $NF_3$, $F_2$ . . . .

Further, as indicated previously, oxygen may be added to the fluorinated etch gases, especially in the case of $SF_6$. In this case, the passivation obtained in conventional cryogenic etching is launched during the etch steps. Thereby, the $SiF_4/O_2$ passivation steps may be inserted at a lower frequency and for shorter time periods. It can then be seen that the roughness of the sides is decreased and that the etch rate is increased, the other benefits of the method according to the present invention being kept.

EXAMPLE

It may for example be worked in the following conditions:

etching: $SF_6$ flow rate: 200 standard cm³ per minute (sccm) with a possible addition of 13 sccm Of $O_2$, passivation: $SiF_4$ flow rate: 20 sccm and $O_2$ flow rate 13 sccm, in both cases, plasma conditions:
pressure: 3 Pa,
RF source power: 1000 W,
biasing: −60 V.

Under such conditions, an etch rate of 6 μm per minute is obtained in a trench having a 10-μm opening.

More generally, during the etching, the proportion between oxygen and sulfur hexafluoride may be on the order of from 5 to 10%. During the passivation steps, the proportion between oxygen and silicon tetrafluoride may be on the order of from 50 to 80%.

The $SF_6$ flow rate for example ranges between 100 and 1000 sccm, preferably between 200 and 400 sccm. The $SiF_4$ flow rate for example ranges between 5 and 50 sccm, preferably close to 20 sccm. The 02 flow rate for example ranges between 5 and 100 sccm, preferably between 10 and 35 sccm. The gas injection is pulsed, that is, the gaseous mixture is changed without turning off the plasma.

Of course, the present invention is likely to have various alterations, modifications and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of anisotropic plasma etching of a silicon wafer, maintained at a temperature from −40° C. to −120° C., comprising alternated and repeated steps of:
    etching with injection of a fluorinated gas, into the plasma reactor at a first flow rate, and
    passivation with injection of silicon tetrafluoride, $SiF_4$, and of oxygen into the plasma reactor at a second flow rate, the flow rate of the gases in the plasma reactor being on the order of from 10% to 25% of the gas flow rate during the etch step.

2. The method of claim 1, wherein the fluorinated gas is selected from the group comprising $SF_6$, $NF_3$, $F_2$.

3. The method of claim 2, wherein the fluorinated gas is sulfur hexafluoride ($SF_6$).

4. The method of claim 3, wherein the temperature is maintained at approximately −90° C.

5. The method of claim 3, wherein during the passivation steps, the proportion between oxygen and silicon tetrafluoride is on the order of from 50% to 80%.

6. The method of claim 3, wherein an oxygen injection is performed into the plasma reactor during the etch steps.

7. The method of claim 6, wherein the proportion between oxygen and sulfur hexafluoride is on the order of from 5% to 10%.

* * * * *